United States Patent
Ohashi

(10) Patent No.: US 6,608,368 B2
(45) Date of Patent: *Aug. 19, 2003

(54) SEMICONDUCTOR DEVICE WITH POWER SOURCE CONDUCTOR PATTERN AND GROUNDING CONDUCTOR PATTERN

(75) Inventor: Yasuhide Ohashi, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,456

(22) Filed: Feb. 24, 1998

(65) Prior Publication Data

US 2002/0020899 A1 Feb. 21, 2002

(30) Foreign Application Priority Data

Feb. 27, 1997 (JP) .............................................. 9-044391
Oct. 15, 1997 (JP) .............................................. 9-282169

(51) Int. Cl.⁷ ............................................. H01L 23/495
(52) U.S. Cl. ...................... 257/668; 257/691; 257/666; 257/690
(58) Field of Search ................................ 257/678, 691, 257/673, 668, 666, 680, 690

(56) References Cited

U.S. PATENT DOCUMENTS

| 4,801,999 | A | * | 1/1989 | Hayward et al. | 357/70 |
| 4,967,261 | A | * | 10/1990 | Niki et al. | 357/70 |
| 5,097,271 | A | * | 3/1992 | Lee et al. | 346/76 PH |
| 5,212,402 | A | * | 5/1993 | Higgins | 257/532 |
| 5,252,853 | A | * | 10/1993 | Michii | 257/666 |
| 5,334,803 | A | * | 8/1994 | Yamamura et al. | 174/52.4 |
| 5,585,665 | A | * | 12/1996 | Anjoh et al. | 257/666 |
| 5,585,666 | A | * | 12/1996 | Imamura | 257/668 |
| 5,801,434 | A | * | 9/1998 | Sugahara | 257/668 |

FOREIGN PATENT DOCUMENTS

| JP | 57-35361 | | 2/1982 |
| JP | 59-39930 | | 3/1984 |
| JP | 60-1968 | | 1/1985 |
| JP | 63-18335 | | 4/1988 |
| JP | 5-82585 | | 4/1993 |
| JP | 8-227910 A | | 9/1996 |
| JP | 01289276 | * | 11/1996 |
| JP | 01-289276 | * | 11/1996 |
| JP | 08-316270 | * | 11/1996 |
| JP | 08316270 | * | 11/1996 |
| JP | 8-340073 | | 12/1996 |

OTHER PUBLICATIONS

English–language abstract of J08255811.
English–language abstract of J08298298.

* cited by examiner

Primary Examiner—David L. Talbott
Assistant Examiner—Luan Thai
(74) Attorney, Agent, or Firm—Oliff & Berridge, PLC

(57) ABSTRACT

A semiconductor chip defines an active surface on which a plurality of signal pads, a plurality of power source pads and a plurality of grounding pads are provided. A flexible insulation substrate defines an opening section by removing a section of the insulation member, and a power source conductor pattern and a grounding conductor pattern are formed to extend across the opening section. The power source conductor pattern and the grounding conductor pattern are provided with connection branches that are narrower than power source pads and grounding pads.

5 Claims, 7 Drawing Sheets

FIG. I
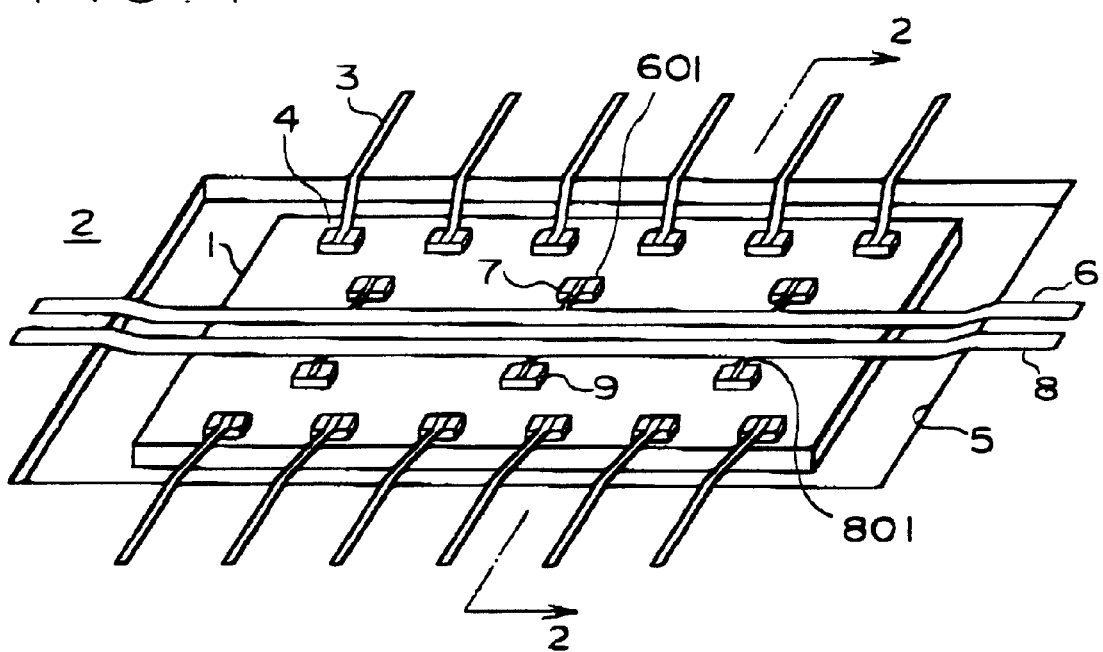
FIG. 2
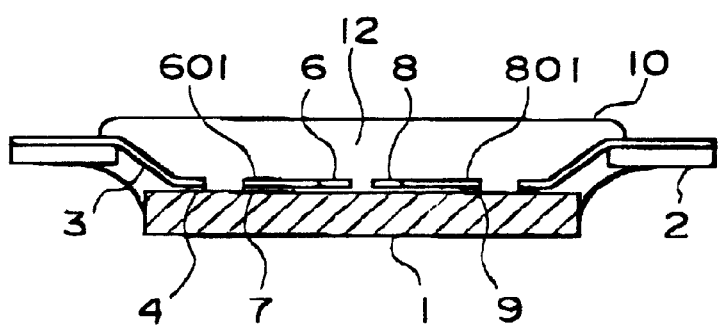

SEMICONDUCTOR DEVICE WITH POWER SOURCE CONDUCTOR PATTERN AND GROUNDING CONDUCTOR PATTERN

BACKGROUND OF THE INVENTION

1. Field of Invention

The present invention relates to a semiconductor device.

2. Description of Related Art

In recent years, semiconductor devices in which a flexible circuit substrate and a semiconductor chip are coupled to one another and sealed by resin are used. A method of lowering the power source impedance of such a semiconductor device and reducing electrical noise is described, for example, in Japanese Laid-open Patent Application HEI 5-82585 at column 9 and FIG. 2 thereof. The conventional structure of the semiconductor device will be described below with reference to FIG. 9.

A semiconductor chip 1 has a plurality of signal pads (signal electrodes) 4, power source pads (power source electrodes) 7 and grounding pads (grounding electrodes) 9 provided on an active surface of the chip 1. These pads are treated with a bump forming process. A TAB tape 2 defines a device hole 5, and has a plurality of signal leads 3 protruding into the device hole 5, and a power source common lead 6 and a grounding common lead 8 extending across the device hole 5. The signal leads 3 are electrically, directly connected to predetermined ones of the signal pads 4 Further, the power source common lead 6 is electrically, directly connected to all of the plurality of power source pads 7, and the grounding common lead 8 is also electrically, directly connected to all of the plurality of grounding pads 9. The leads 3, 6 and 8 and the pads 4, 7 and 9 are electrically connected by a package connecting method using heat and pressure.

However, in the above-described conventional semiconductor device, each of the power source common lead and the grounding common lead is narrower than the width of each of the bumps formed for the power source pads and the grounding pads, and therefore the power source impedance cannot be sufficiently reduced. Furthermore, when these common leads are electrically connected to the corresponding pads by heat-and-pressure bonding, stress is generated by the heat and the pressure applied to the common leads. As a result, cracks are likely generated in the common leads, and the cracks may develop after the device is assembled in an electronic device and may eventually result in the snapping of the common leads.

Also, when an electronic device is provided with the conventional semiconductor device, the power source impedance cannot be sufficiently lowered. As a result, the electronic device with high-frequency operation or with high current consumption is suffered from problems in which electrical noise cannot be improved. Moreover, since line-breaking problems are likely to occur in the power source line and the grounding line, it is difficult to secure long-term reliability.

Also, in the above-described semiconductor device, the power source common lead 6 and the grounding common lead 8, that protrude into the device hole 5 of the TAB tape 2, are supported only by their own ends, respectively. As a result, the leads 6 and 8 slacken by their own weight, and therefore, positioning of the leads with respect to the power source pads 7 and the grounding pads 9 is difficult.

SUMMARY OF THE INVENTION

It is an object of the present invention to provide a semiconductor device which has a sufficiently low power source impedance, and eliminates line-snapping problems that may occur in a power source common lead and a grounding common lead.

Furthermore, it is another object of the present invention to facilitate positioning of a power source common lead or a grounding common lead with respect to power source electrodes or grounding electrodes, respectively.

It is also another object of the present invention to provide an electronic device that reduces electrical noise and assures a long-term reliability.

To achieve the above-described objects, a semiconductor device of a first aspect of the present invention is formed, for example, from a semiconductor chip, a circuit substrate including a flexible insulation substrate and conductor patterns formed thereon, and sealing resin. The conductor patterns that protrude into an opening defined in the flexible insulation substrate are coupled to the semiconductor chip, and the coupling section is sealed by the sealing resin. It is preferred that at least one of the conductor patterns is formed to extend across the opening and has a specified width wider than a pad for connecting to the semiconductor chip.

In accordance with the invention thus structured, the conductor pattern that defines a common lead extending across the opening has a width wider than the pad for connecting to the semiconductor chip. As a consequence, the current carrying capacity is increased and the power source impedance is substantially lowered.

In a semiconductor device of a second aspect of the present invention, the conductor pattern formed to extend to across the opening preferably has a bent section at least one location.

In accordance with this embodiment, the bent section reduces the stress generated in the conductor pattern when it is electrically connected to the corresponding pads so that generation of cracks in the conductor pattern can be prevented. Consequently, it is effective in preventing the line-snapping resulting from cracks which may grow after assembled in an electronic device.

An electronic device of a third aspect of the present invention includes a semiconductor device as described above, and one of a display device, a printing device and a computer device which is driven by the semiconductor device In accordance with the above-described invention, the power source impedance is substantially lowered and the electrical noise is improved because of the provision of a semiconductor device set forth in the first aspect. Also, the line-snapping of the power source line is eliminated and a substantially long-term reliability is secured because of the provision of a semiconductor device set forth in the second aspect.

A semiconductor device of a fourth aspect of the present invention is preferably formed from a semiconductor chip, a circuit substrate including a flexible insulation substrate and conductor patterns formed thereon, and sealing resin. The conductor patterns that protrude into an opening defined in the flexible insulation substrate are coupled to the semiconductor chip, and the coupling section is sealed by the sealing resin. It is preferred that at least one of the conductor patterns is formed to extend across the opening and has at least one or more connection branch, wherein the connection branch has a specified width narrower than a pad for connecting to the semiconductor chip.

In accordance with the above-described invention, the connection branch branching out the conductor pattern and having a width narrower than the pad is used to electrically connect the pad to the conductor pattern. As a result, the width of the conductor pattern can be made wider without making the post-connection examination difficult, and therefore the power source impedance can be substantially lowered.

In a semiconductor device of a fifth aspect of the present invention, the conductor pattern formed to extend across the opening in the semiconductor device described above preferably has a specified width wider than the pad. As a result, the current carrying capacity of the conductor pattern is made larger and the power source impedance is substantially lowered.

In a semiconductor device of a sixth aspect of the prevent invention, the conductor pattern formed to extend across the opening in the semiconductor device set forth above preferably has a bent section at least one location thereof. This results in the same effect obtained by the invention set forth in the second aspect.

An electronic device of a seventh aspect of the present invention preferably includes a semiconductor device described above, and one of a display device, a printing device and a computer device which is driven based on the semiconductor device. In accordance with this invention, the power source impedance is substantially lowered and the electrical noise is improved without making the post-connection examination difficult as a result of the provision of a semiconductor device set forth in the fourth aspect. Also, the line-snapping of the power source line is eliminated and a substantially long-term reliability is secured because of the provision of a semiconductor device set forth in the fifth aspect.

A semiconductor device of an eight aspect of the present invention is preferably formed from a semiconductor chip, a circuit substrate including a flexible insulation substrate and conductor patterns formed thereon, and sealing resin. The conductor patterns that protrude into an opening defined in the flexible insulation substrate are coupled to the semiconductor chip, and the coupling section is sealed by the sealing resin. It is preferred that at least one of a power source electrode and a grounding electrode of the semiconductor chip is larger than a signal electrode thereof.

In the invention thus structured, the power source electrode or the grounding electrode of the semiconductor chip, in which a larger current flows than in the signal electrode, is preferably made larger than the signal electrode. As a result, the power source impedance is lowered and the electrical noise is improved. Also, the number of power source electrodes or grounding electrodes of a semiconductor chip can be reduced, with the result that further miniaturization and simplification of a semiconductor device are achieved.

In the semiconductor device of a ninth aspect of the present invention, the conductor patterns that define common leads to be connected to the power source electrode or the grounding electrode are also preferably formed to extend across the opening of the flexible insulation substrate. The conductor patterns are formed to have a width wider than the power source electrode or the grounding electrode, and provided with connection branches having a width narrower than the electrode. Also, the connection branch may be connected to the flexible insulation substrate.

An electronic device of a tenth aspect of the present invention preferably includes a semiconductor device set forth above, and one of a display device, a printing device and a computer device which is driven based on the semiconductor device. The electronic device of the present invention thus structured provides the same effects described above.

A semiconductor device of an eleventh aspect of the present invention is preferably formed from a semiconductor chip, a circuit substrate including a flexible insulation substrate and conductor patterns formed thereon, and sealing resin. The conductor patterns protrude into an opening defined in the flexible insulation substrate, and are coupled to the semiconductor chip. The coupling section is sealed by the sealing resin. It is preferred that at least one of the conductor patterns is formed to extend across the opening, and has at least one or more branch, wherein the branch has a tip section connected to the flexible insulation substrate.

In accordance with the invention thus structured, since the tip sections of the branches are connected to the flexible insulation substrate, the branches act as support members to support the conductor patterns that define common leads and extend across the opening. Therefore, the common leads and the electrodes of the semiconductor chip are readily and securely aligned with one another.

In a semiconductor device of a twelfth aspect of the present invention, the branches preferably define connection branches to be coupled to the semiconductor chip. In accordance with the invention thus structured, the common leads and the electrodes of the semiconductor chip are readily and correctly aligned with one another. Moreover, the width of the conductor pattern can be made wider without making the post-connection examination difficult, and thus the power source impedance is substantially lowered. Moreover, the conductor patterns extending across the opening may be provided with bent sections in a similar manner as the above-described invention, and the connection branch may preferably be formed to have a width narrower than the pad.

An electronic device of a thirteenth aspect of the present invention preferably includes a semiconductor device as described above, and one of a display device, a printing device and a computer device which is driven based on the semiconductor device. The invention thus structured provide effects similar to those described above.

In a tape carrier package type semiconductor device of a fourteenth aspect of the present invention, the semiconductor device preferably includes conductor patterns for power source and grounding, each traversing a device hole and having at least one branched connection inner lead, wherein the connection inner lead has a specified width narrower than a pad for connection to a semiconductor chip.

In accordance with the invention described above, the connection inner leads branched out from the conductor patterns are used for electrically connecting the pads provided on the semiconductor chip to the conductor patterns. As a result, the width of the conductor pattern can be made wider without making the post-connection examination difficult, and therefore the power source impedance can be substantially lowered.

As the connection inner leads are connected to a tape that forms a tape carrier, the power source conductor pattern and the grounding conductor pattern are prevented from having a slack. Therefore, these conductor patterns can be readily and correctly positioned with respect to the electrodes of the semiconductor chip. Also, the power source conductor pattern and the grounding conductor pattern may be provided with at least one or more bent sections in order to prevent growth of cracks in the conductor patterns after being assembled in an electronic device, and to thereby prevent the patterns from snapping.

An electronic device of a fifteenth aspect of the present invention preferably includes a semiconductor device as described above, and one of a display device, a printing device and a computer device which is driven based on the semiconductor device. The electronic device of the present invention thus structured provides the same effects described above.

BRIEF DESCRIPTION OF THE DRAWINGS

FIG. 1 shows a perspective view of a main portion of a first preferred embodiment of the present invention.

FIG. 2 shows a cross-sectional view taken along lines 2—2 of FIG. 1.

DETAILED DESCRIPTION OF PREFERRED EMBODIMENTS

Figure 3:
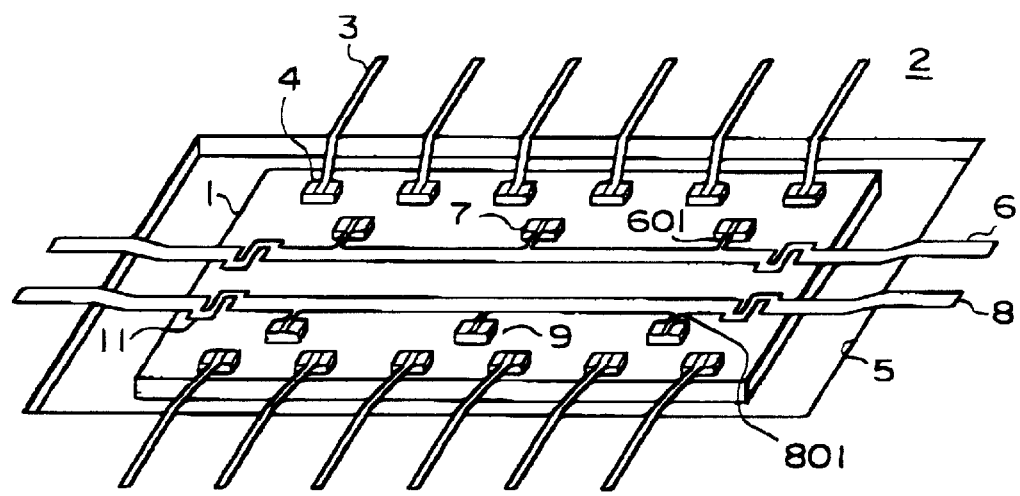
FIG. 3 shows a perspective view of a main portion of a second preferred embodiment of the present invention.

Embodiments of the present invention will be described below with reference to the accompanying drawings.

FIG. 1 is a perspective view of a main section of a semiconductor device in accordance with a first preferred embodiment of the present invention. A semiconductor chip has an active surface on which a plurality of pads for signal (signal electrodes) 4, a plurality of pads for power source (power source electrodes) 7 and a plurality of pads for grounding (grounding electrodes) 9 are provided. The signal pads 4 are formed along peripheral edges of the semiconductor chip 1. On the other hand, the power source pads 7 and the grounding pads 9 are disposed in lines respectively in a central area of the semiconductor chip 1.

Groups of these pads are provided with bumps for electrical connection to conductor patterns which will be described below. A flexible insulation substrate 2 which defines a circuit substrate is provided with an opening section 5, and signal conductor patterns 3 protrude in the opening section 5. A power source conductor pattern 6 defining a power source common lead and a grounding conductor pattern 8 defining a grounding common lead are provided across the opening section 5. The opening section 5 is provided for connecting the pads 4, 7 and 9 disposed on the semiconductor chip 1 to the conductor patterns 3, 6 and 8. Therefore, the opening section 5 may only require an area which is enough for disposing the pads 4, 7 and 9 therein.

Therefore, the size (area) of the opening section 5 may be either larger or smaller than the size of the semiconductor chip 1 (the area of the semiconductor chip 1).

The power source conductor pattern 6 is provided with connection branches 601, each of which is narrower than the bump provided on the power source pad 7. In a similar manner, the grounding conductor pattern 8 is also provided with connection branches 801, each of which is narrower than the grounding pad 9 in a shape of a bump. The signal conductor patterns 3 are electrically, directly connected to corresponding ones of the signal pads 4. Each of the connection branches 601 is formed to have a width narrower than the power source pad 7 in a shape of a bump. The connection branches 601 are electrically, directly connected to corresponding ones of the power source pads 7. In a similar manner, each of the connection branches 801 is also formed to have a width narrower than the grounding pad 9 in a shape of a bump. The connection branches 801 are electrically, directly connected to corresponding ones of the grounding pads 9. The connection is preferably performed by a package connection method using heat and pressure.

FIG. 2 is a cross-sectional view taken along lines 2—2 of FIG. 1. In FIG. 2, the same reference numerals used in FIG. 1 are used for the same elements. The active surface of the semiconductor chip 1, the signal conductor patterns 3, the power source conductor pattern 6 and the grounding conductor pattern 8 are sealed by a sealing member 10 in the coupling section 12.

It is clear from FIG. 1 that the power source conductor pattern 6 and the grounding conductor pattern 8 may be made wider than the power source pads 7 and the grounding pads 9, respectively, without having to completely cover these pads. Accordingly, the power source impedance is substantially lowered, electrical noise is improved and examination is readily performed after the electrical connection is completed.

FIG. 3 is a perspective view of the structure of a main portion of a semiconductor device in accordance with a second preferred embodiment of the present invention. In FIG. 3, the same reference numerals used in FIG. 1 are used for the same elements. Each of the power source conductor pattern 6 and the grounding conductor pattern 8 is provided with bent sections 11. The bent sections 11 may be provided at any appropriate locations. As shown in the figure, the bent sections 11 are provided within the opening section 5 at locations within which the pads are disposed. In other words, the bent sections 11 are disposed at both ends of the conductor patterns within the opening section 5. Alternatively, the bent sections 11 may be provided at one end of the conductor pattern within the opening area 5, though the effects thereof are somewhat diminished. Also, the bent sections 11 may not necessarily be provided adjacent the edges of the opening section 5, but may be provided within the opening section 5 at any locations except areas at which the conductor pattern is connected to the pads. Also, the bent sections 11 may be provided at both ends of the conductor pattern as well as in an internal area of the opening section 5.

It is clear from FIG. 3 that, when the power source conductor pattern 6 and the grounding conductor pattern 8 are electrically connected to the corresponding groups of the pads, stress generated in the conductor patterns by the heat and pressure is absorbed by the bent sections 11. As a result, the generation of cracks in the conductor patterns is prevented. In other words, conductor patterns (for power source and grounding) formed to extend across a device hole are connectable, and in particular, they are connectable together with the pads in a package.

Figure 4A:
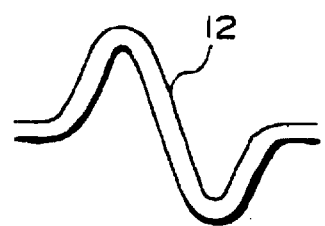
FIGS. 4A–4C show bent sections in accordance with other preferred embodiments of the present invention.
Figure 4B:
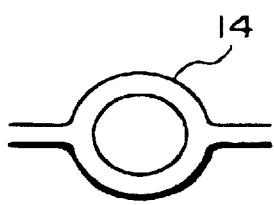
Figure 4C:
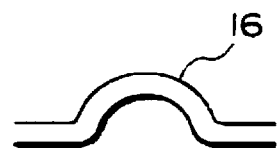

FIGS. 4A–4C show other preferred embodiments of the bent section. FIG. 4A shows a bent section 12 in the form of the letter S, which can avoid stress concentration and generation of cracks better than the bent section 11 shown in FIG. 3. FIG. 4B shows a bent section 14 in the form of a ring. When tensile stresses are generated in the bent section 14 in the left-to-right direction, the bent section 14 deforms into an oval shape and absorbs the stresses. FIG. 4C shows a bent section 16 in the form of a semi-circle, which can absorb stresses and prevent the snapping of the conductor patterns in a similar manner described above.

The shape of the bent section is not limited to the embodiments described above. Also, a TAB tape that forms a tape carrier may be used for the flexible insulation substrate 2.

Figure 5:
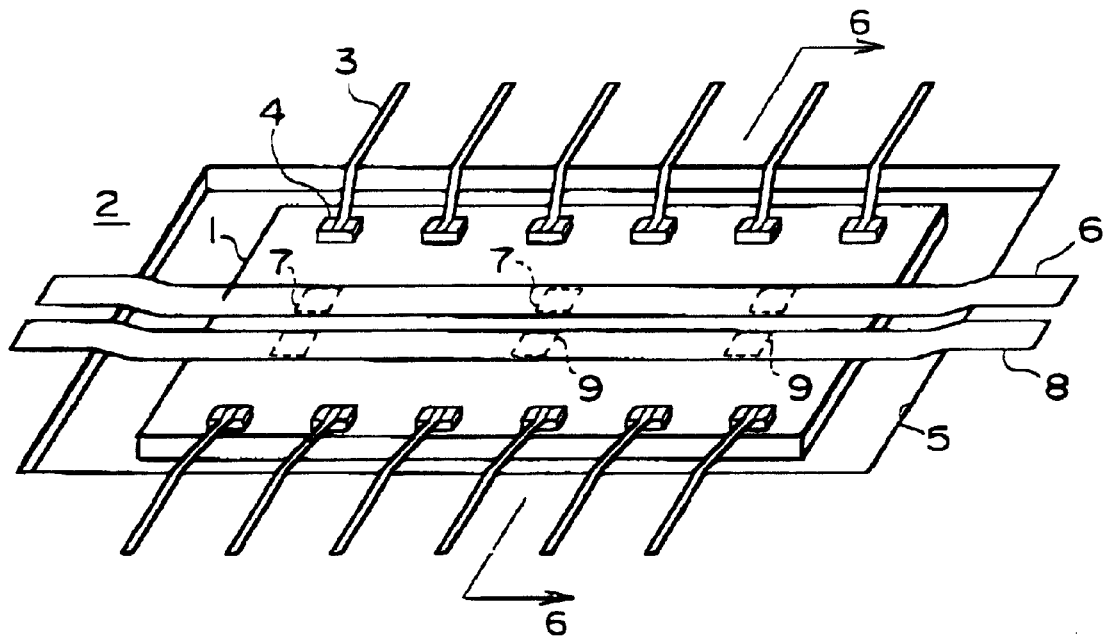
FIG. 5 shows a perspective view of a main portion of a semiconductor device in accordance with a third preferred embodiment of the present invention.
Figure 6:
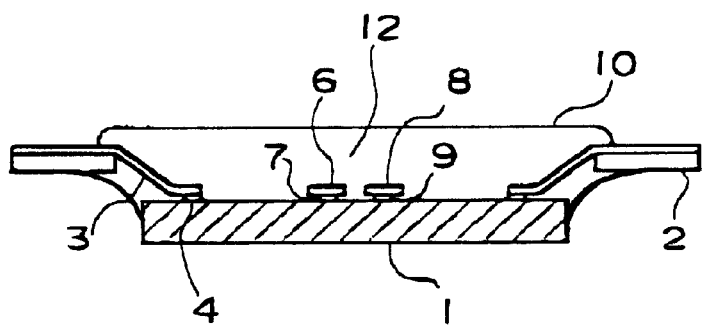
FIG. 6 shows a cross-sectional view taken along lines 6—6 of FIG. 5.

FIG. 5 is a perspective view of a main portion of a semiconductor device in accordance with a third preferred embodiment of the present invention. FIG. 6 is a cross-sectional view taken along lines 6—6 of FIG. 5. As shown in these figures, the power source conductor pattern 6 and the grounding conductor pattern 8 are positioned over the power source pads 7 and the grounding pads 9 as the semiconductor chip 1 is disposed in the opening section 5. Also, the power source conductor pattern 6 and the grounding conductor pattern 8 are formed to be wider than the power source pads 7 and the grounding pads 9, respectively.

As a result, the power source conductor pattern 6 and the grounding conductor pattern 8 have a greater current capacity, the power source impedance is substantially reduced and the electrical noise is improved. Further, since the conductor patterns 6 and 8 are wider than the pads 7 and 9, respectively, they are readily aligned with one another, and therefore a greater tolerance is set against manufacturing errors.

Figure 7:
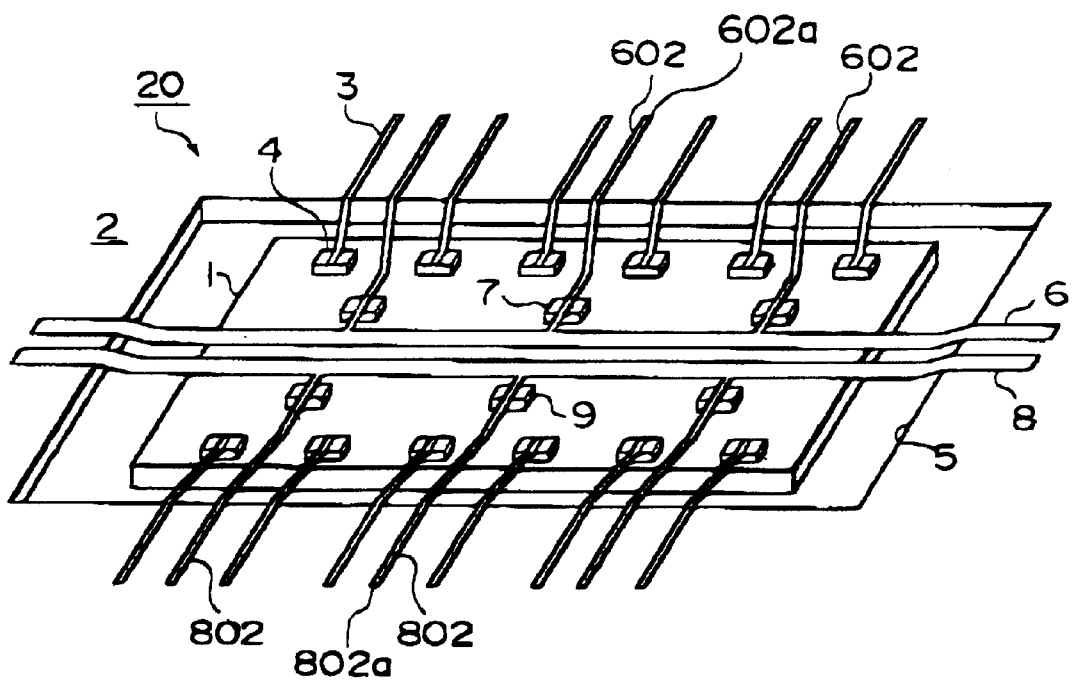
FIG. 7 shows a perspective view of a main portion of a semiconductor device in accordance with a fourth preferred embodiment of the present invention.

FIG. 7 is a perspective view of a main portion of a semiconductor device in accordance with a fourth preferred embodiment of the present invention. In the semiconductor device in accordance with this embodiment, the power source conductor pattern 6 and the grounding conductor pattern 8 are provided with connection branches 602 and 802, respectively. The branches 602 and 802 are formed to have a width narrower than the power source pads 7 and the grounding pads 9, respectively, and have a length that reaches upper sections of the flexible insulation substrate 2 with their tip sections 602a and 802a being connected to the flexible insulation substrate 2.

In the semiconductor device in accordance with the fourth preferred embodiment thus structured, the connection branches 602 and 802 connected to the flexible insulation substrate 2 function as support members for supporting the power source conductor pattern 6 and the grounding conductor pattern 8 that extend across the opening section 5. As a result, the conductor patterns 6 and 8 are prevented from slackening, and the positioning between the power source pads 7 and the connection branches 602 and the positioning between the grounding pads 9 and the connection branches 802 are readily and precisely performed. Further, since the connection branches 602 and 802 extend as far as the flexible insulation substrate 2, the plural power source pads 7 and grounding pads 9 are not required to be linearly disposed. Accordingly, the degree of freedom in disposing the pads 7 and 9 is increased and therefore design of the semiconductor chip 1 is facilitated. In this embodiment, the connection branches are extended to points on the flexible insulation substrate 2 to support the power source conductor pattern and the grounding conductor pattern. However, the connection branches that are connected to the pads are not necessarily used. For example, if the power source pads and the grounding pads are concentrated in one region and scarcely disposed in the other region, dummy patterns exclusively used for supporting purposes may be formed in the region where the pads are scarcely disposed. Preferably, the supporting members are disposed at equal intervals.

Figure 8:
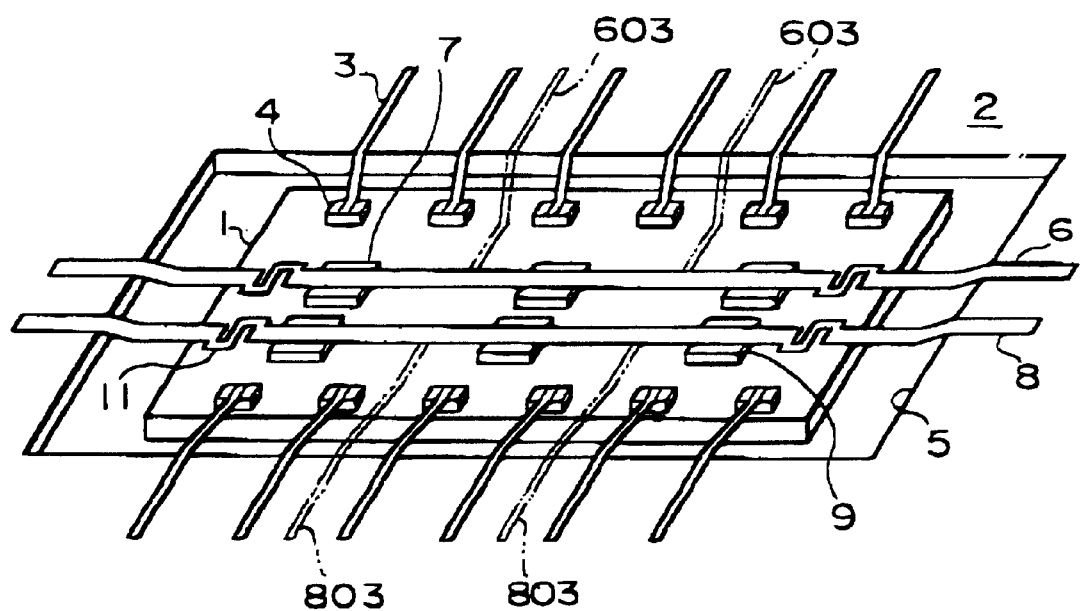
FIG. 8 shows a perspective view of a main portion of a semiconductor device in accordance with a fifth preferred embodiment of the present invention.
Figure 9:
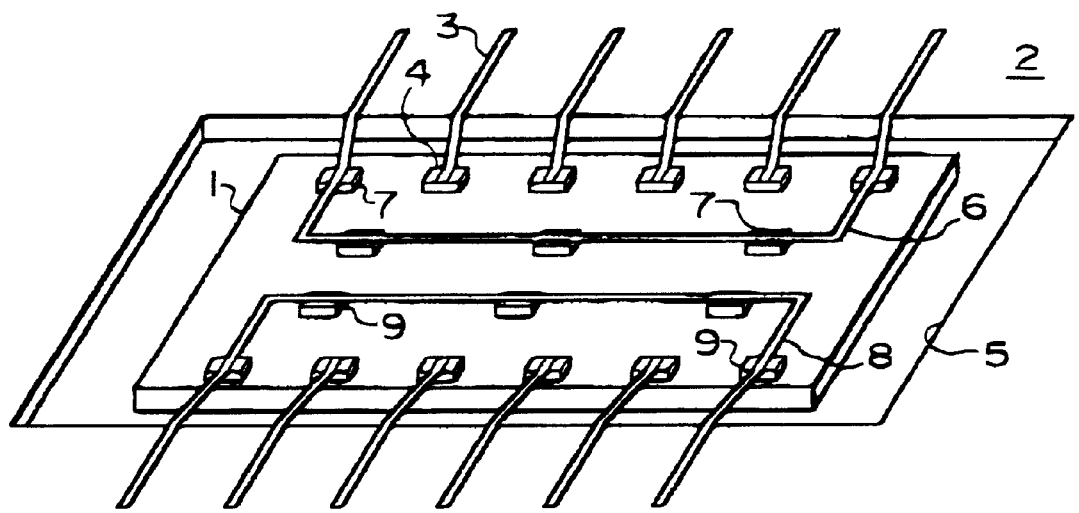
FIG. 9 shows a perspective view of a main portion of a conventional semiconductor device.

FIG. 8 is a perspective view of a main portion of a semiconductor device in accordance with a fifth preferred embodiment of the present invention. In the semiconductor device of this embodiment, the power source pads 7 defining power source electrodes of the semiconductor chip 1 and the grounding pads 9 defining grounding electrodes of the semiconductor chip 1 are formed to be larger than the signal pads 4 defining signal electrodes of the semiconductor chip 1. Also, the power source conductor pattern 6 and the grounding conductor pattern 8 to be connected respectively to the power source pads 7 and the grounding pads 9 are formed to be wider than the signal conductor patterns 3. As a result, impedance of each of the power source pads 7 and the grounding pads 9 is lowered, and therefore the power source impedance is lowered and electrical noise is improved.

In accordance with the above-described fifth preferred embodiment, both of the power source pads 7 and the grounding pads 9 are larger than the signal pads 4. However, in other embodiments, either the power source pads 7 or the grounding pads 9 are larger than the signal pads 4, and the other may be made to have the same size as that of the signal pads 4. In another embodiment, the width of the power source conductor pattern 6 and the width of the grounding conductor pattern 8 are wider than the power source pads 7 and the grounding pads 9, respectively. In a further embodiment, the power source conductor pattern 6 and the grounding conductor pattern 8 are provided with connection branches to be connected to the power source pads 7 and the grounding pads 9, respectively. Also, the tip sections of the connection branches may be connected to the flexible insulation substrate 2.

In an embodiment, the power source conductor pattern 6 and the grounding conductor pattern a are provided with branches 603 and 803, and the tips of the branches 603 and 803 are connected to the flexible insulation substrate 2, as shown by a two-dot-and-dash line in FIG. 8. By this structure, the power source conductor pattern 6 and the grounding conductor pattern 8 that are formed to extend across the opening section 5 are prevented from having a slack, the conductor patterns 6 and 8 are readily positioned with respect to the power source pads 7 and the grounding pads 9, respectively, and the bent sections 11 are prevented from stretching.

A device, such as, for example, a display device, a printer device, a computer device or the like, is driven by a semiconductor device in accordance with any one of the first embodiment through the fifth embodiment of the present invention, and the display device, the printer device or the computer device is assembled in an electronic device. As a result, the power source impedance of the electronic device is substantially lowered, and the electrical noise is improved. Furthermore, the electronic device has a long-term reliability without having line-snapping problems 5 in the power source line.

As described above, in a semiconductor device in accordance with the present invention, a conductor pattern defining a common lead that is formed to extend across an opening section is formed to be wider than bumps for connecting the conductor pattern to a semiconductor chip. As a result, the current carrying capacity is increased, and the power source impedance is substantially lowered Also, in a semiconductor device in accordance with the present invention, a power source conductor pattern or a grounding conductor pattern can be made relatively wide. As a consequence, it is effective to substantially lower the power source impedance. Furthermore, generation of cracks in the conductor patterns is prevented, and thus line-snapping troubles of the power source line do not occur after the semiconductor device is assembled in an electronic device.

Further, in a semiconductor device in accordance with the present invention, conductor patterns extending across an opening section are provided with connection branches whose tip sections are connected to a flexible insulation substrate. As a result, the conductor patterns are prevented from having a slack, and readily and correctly aligned with respect to electrodes of a semiconductor chip to be connected thereto.

Also, an electronic device in accordance with the present invention is equipped with a semiconductor device that has a substantially low power source impedance. Accordingly, it is effective to improve electrical noise. Furthermore, since the electronic device is equipped with a semiconductor device having a power source line which does not have line-snapping problems, a substantially long-term reliability is secured.

Figure 10:
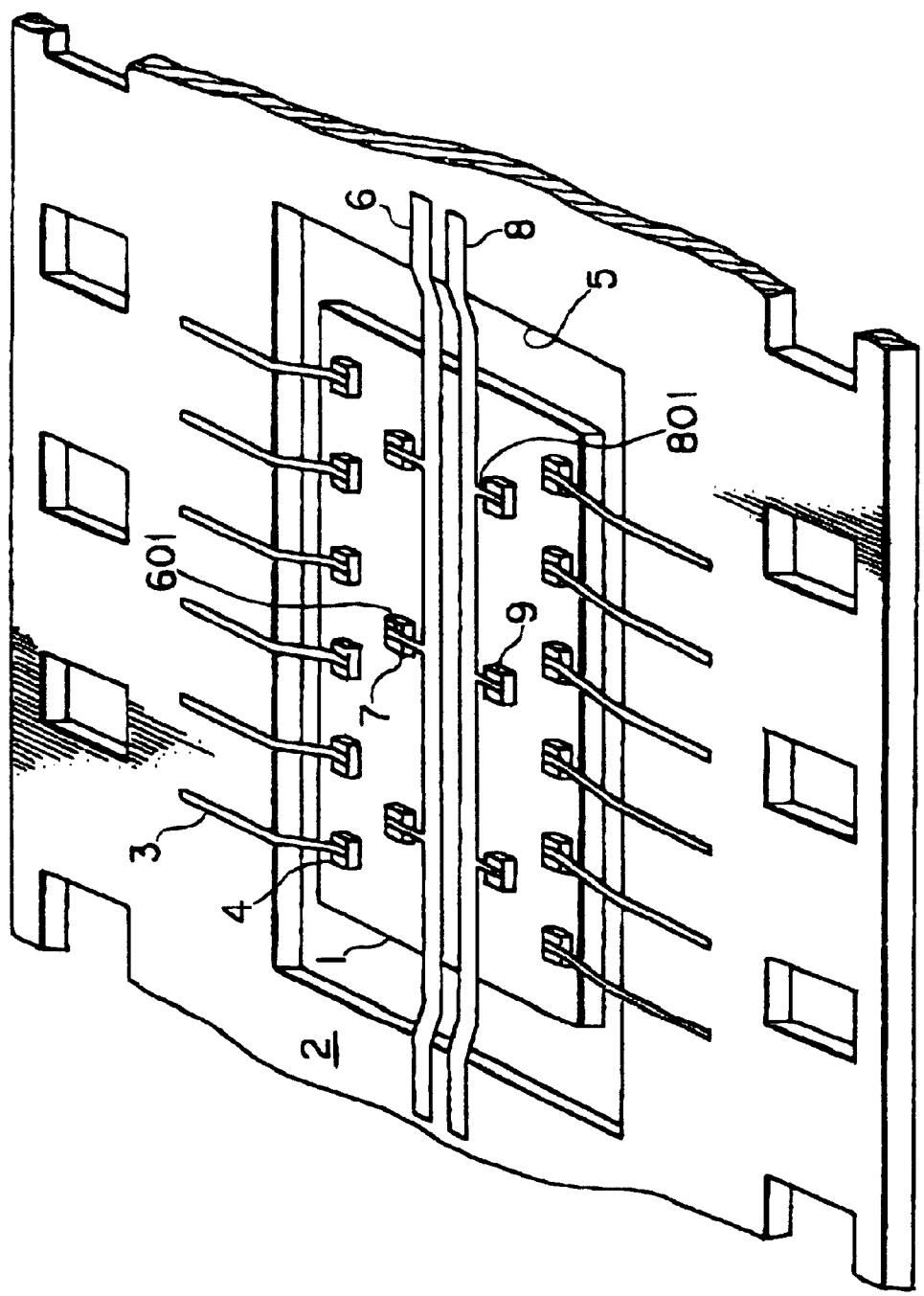
FIG. 10 shows a perspective view of a tape carrier package type semiconductor device of a preferred embodiment of the invention.
Figure 11:
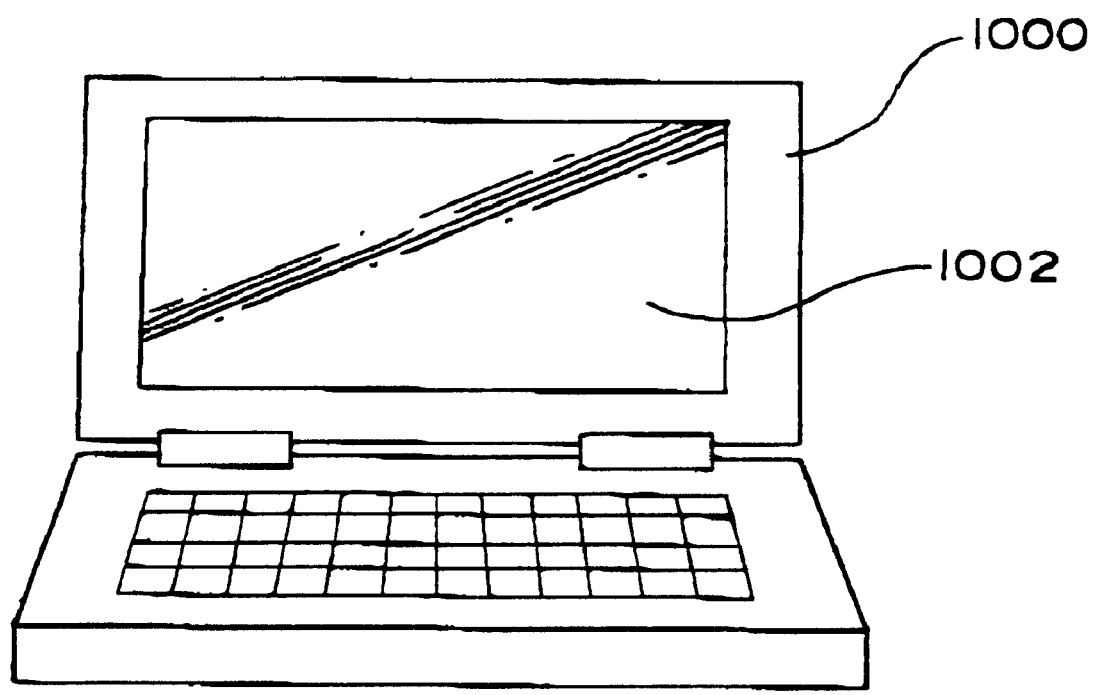
FIG. 11 shows an electronic device of a preferred embodiment of the invention.

FIG. 10 shows a tape carrier package type semiconductor device of the invention having an opening section 5 as a device hole. FIG. 11 shows a personal computer device as an example of an electronic device of the invention. The invention can also be applied to another display device or a printing device and so on.

What is claimed is:

1. A semiconductor device, comprising:

a semiconductor chip having a plurality of pads; and a flexible substrate having an opening formed therein, the flexible substrate having a common lead having an electrical connection branch connected to one of the pads without support by the flexible substrate, the common lead having a middle portion, the middle portion extending from two edges of the opening and continuously being positioned inside the opening without connection to the pads, and end portions of the common lead being formed on the flexible substrate.

2. A semiconductor device, comprising:

a semiconductor chip having a plurality of pads; and a flexible substrate having an opening formed therein, the flexible substrate having a plurality of leads formed on the flexible substrate and protruding in the opening, the flexible substrate having a common lead, the common lead having a middle portion, the middle portion extending from two edges of the opening and being continuously positioned inside the opening, and end portions of the common lead being formed on the flexible substrate, wherein all of the leads protrude in the opening in a direction different from a direction in which the common lead protrudes in the opening, and wherein the leads and the common lead are connected to the pads.

3. The semiconductor device according to claim 2, wherein the common lead has an electrical connection branch, a portion of the electrical connection branch is positioned in the opening, an other portion of the electrical connection branch is formed on the flexible substrate, and the electrical connection branch and the leads protrude in the opening in the same direction.

4. A flexible substrate having an opening formed therein, comprising:

a plurality of leads formed on the flexible substrate and protruding in the opening; and a common lead having a middle portion, the middle portion extending from two edges of the opening and being continuously positioned inside the opening, and end portions of the common lead being formed on the flexible substrate, wherein all of the leads protrude in the opening in a direction different from a direction in which the common lead protrudes in the opening.

5. The flexible substrate according to claim 4, wherein the common lead has an electrical connection branch, a portion of the electrical connection branch is positioned in the opening, another portion of the electrical connection branch is formed on the flexible substrate, and the electrical connection branch and the leads protrude in the opening in the same direction.

* * * * *